(12) United States Patent
Xu et al.

(10) Patent No.: US 11,087,961 B2
(45) Date of Patent: Aug. 10, 2021

(54) QUARTZ COMPONENT WITH PROTECTIVE COATING

(71) Applicant: Lam Research Corporation, Fremont, CA (US)

(72) Inventors: Lin Xu, Fremont, CA (US); Robin Koshy, Fremont, CA (US); John E. Daugherty, Fremont, CA (US); Satish Srinivasan, Newark, CA (US); David Wetzel, Santa Clara, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 231 days.

(21) Appl. No.: 15/910,739

(22) Filed: Mar. 2, 2018

(65) Prior Publication Data
US 2019/0272981 A1  Sep. 5, 2019

(51) Int. Cl.
*H01J 37/32* (2006.01)
*C23C 16/40* (2006.01)
*C23C 16/56* (2006.01)
*C23C 16/455* (2006.01)

(52) U.S. Cl.
CPC ........ *H01J 37/32495* (2013.01); *C23C 16/40* (2013.01); *C23C 16/45553* (2013.01); *C23C 16/56* (2013.01); *H01J 37/3244* (2013.01); *H01J 37/32119* (2013.01); *H01J 37/32238* (2013.01); *H01J 37/32715* (2013.01)

(58) Field of Classification Search
CPC ............. H01J 37/32119; H01J 37/3244; H01J 37/32495; H01J 37/32238; H01J 37/32715; C23C 16/45553; C23C 16/56; C23C 16/40
See application file for complete search history.

(56) References Cited

U.S. PATENT DOCUMENTS

| 8,728,956 | B2 | 5/2014 | LaVoie et al. | |
| 2003/0185965 | A1* | 10/2003 | Lin | C23C 4/12 427/8 |
| 2004/0002221 | A1* | 1/2004 | O'Donnell | C23C 16/4404 438/710 |
| 2006/0046450 | A1 | 3/2006 | Narendar et al. | |
| 2011/0256734 | A1 | 10/2011 | Hausmann et al. | |

(Continued)

OTHER PUBLICATIONS

Thedjoisworo, Bayu et al. (2012) "Characterization of hydrogen—plasma interactions with photoresist, silicon, and silicon nitride surfaces," *Journal of Vacuum Science & Technology A*, 30:031303.

(Continued)

*Primary Examiner* — Yuechuan Yu
(74) *Attorney, Agent, or Firm* — Weaver Austin Villeneuve & Sampson

(57) ABSTRACT

A quartz structure includes a protective layer comprising yttrium oxide. The quartz structure may be fabricated by: (a) receiving a quartz structure; and (b) coating the quartz structure with a protective layer comprising yttrium oxide to form a part to be used in the plasma reactor. The part has a size and shape adapted for forming a window or injector in a plasma reactor. The protective layer does not substantially change the size or shape of the quartz structure. The part may be installed in the plasma reactor at a location where, during operation, a plasma will contact or be proximate to the part.

31 Claims, 11 Drawing Sheets

(56) References Cited

U.S. PATENT DOCUMENTS

| | | |
|---|---|---|
| 2015/0318148 A1 | 11/2015 | Chen et al. |
| 2015/0376760 A1 | 12/2015 | Naim et al. |
| 2017/0301519 A1 | 10/2017 | Naim et al. |
| 2017/0314124 A1* | 11/2017 | Hwang ............... C23C 16/4585 |
| 2018/0301321 A1* | 10/2018 | Iwasawa ............... C01F 17/206 |

OTHER PUBLICATIONS

Fauchais, P., "Understanding Plasma Spraying", Journal of Physics D: Applied Physics, (Apr. 14, 2004), vol. 37, No. 9, R86-R108.

Pawlowski, Lech, "The Science and Engineering of Thermal Spray Coatings", Second Edition, John Wiley & Sons, Ltd., (Mar. 14, 2008), 647 pages.

* cited by examiner

QUARTZ COMPONENT WITH PROTECTIVE COATING

BACKGROUND

Quartz components configured for use in plasma-based etch operations in a reactor may be etched or otherwise deteriorate upon exposure to plasma contained within the reactor, e.g., particularly to a hydrogen-containing plasma. Traditionally, compromised quartz components are replaced with new components when needed. However, in certain circumstances the deterioration of the quartz features may produce unstable microfeatures capable of breaking free from the quartz surface to fall on and potentially interfere with a substrate positioned beneath the quartz surface upon which electronic devices may be manufactured.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

One aspect of the disclosure concerns a quartz component having a size and shape adapted for use as a component of a plasma reactor, and a protective layer comprising yttrium oxide disposed on at least one surface of the quartz structure that, when installed, faces an interior region of the plasma reactor. The protective layer does not substantially change the size or shape of the quartz structure.

In some embodiments, the quartz component has a size and shape to serve as a window between a plasma source located exterior to the plasma reactor and an interior region of the plasma reactor.

Provided herein is a quartz component having a quartz structure having a size and shape adapted for use as a component of a plasma reactor. A protective layer comprising yttrium oxide is disposed on at least one surface of the quartz structure that, when installed, is exposed to plasma generated in the plasma reactor during operation. The protective layer does not substantially change the size or shape of the quartz structure.

In some embodiments, the quartz component has a size and shape to serve as a window between a plasma source located exterior to the plasma reactor and an interior region of the plasma reactor.

In some embodiments, the quartz component is a quartz window configured to be disposed in the plasma reactor at a position permitting radio frequency or microwave power from a radio frequency or microwave source to pass through the quartz window into an interior region of the plasma reactor.

In some embodiments, the quartz window has a thickness of between about 1 cm and 3 cm.

In some embodiments, the quartz window is substantially flat and has a diameter or length that is between about 40 and 100 cm.

In some embodiments, the quartz component is a quartz injector comprising one or more flow passages for introducing gas into an interior region of the plasma reactor and/or removing the gas from the interior region of the plasma reactor.

In some embodiments, the quartz component is a hollow dome.

In some embodiments, the protective layer has a thickness of between about 10 nm and 10 μm. The thickness may be an average thickness over a surface of the quartz component.

In some embodiments, the quartz component has a surface roughness, $R_a$, of between about 0.01 μm and 2 μm. The surface roughness may be an average surface roughness over a surface of the quartz component.

In some embodiments, the protective layer has, on average, a porosity of less than about 1%.

In some embodiments, the protective layer comprises yttrium oxide crystallites having, on average, a largest cross-sectional dimension of between about 10 nm and 100 nm.

In some embodiments, the protective layer comprises at least about 90% by mass yttrium oxide.

In some embodiments, the protective layer comprises at least about 99% by mass yttrium oxide.

Provided herein is a plasma reactor having a substrate support configured to hold a substrate during a plasma processing operation. A plasma source is configured to provide power to an interior region of the plasma reactor where, during operation, a plasma is formed. The plasma reactor has a quartz component comprising: (a) a quartz structure having a size and shape adapted for use as a component of the plasma reactor; and (b) a protective layer comprising yttrium oxide disposed on at least one surface of the quartz structure that, when installed, is exposed to the plasma when formed in of the plasma reactor. The protective layer does not substantially change the size or shape of the quartz structure. The plasma reactor further includes a controller with program instructions for causing the plasma source to provide radio frequency or microwave power to the interior region of the plasma reactor.

In some embodiments, the quartz component in the plasma reactor is disposed at a location where, during operation, the plasma will contact or be proximate to the quartz component.

In some embodiments, the plasma is a hydrogen-containing plasma.

In some embodiments, the plasma reactor is an etching tool, an ashing tool, and/or a deposition tool.

In some embodiments, the plasma source comprises coils.

In some embodiments, the plasma source comprises a radio frequency generator.

In some embodiments, the plasma source comprises a microwave generator.

In some embodiments, the quartz component has a size and shape to serve as a window between the plasma source and the interior region of the plasma reactor.

In some embodiments, the quartz component is a quartz window configured to be disposed in the plasma reactor at a position permitting the radio frequency or microwave power from a radio frequency or microwave source to pass through the quartz window into the interior region of the plasma reactor.

In some embodiments, the quartz window has a thickness of between about 1 cm and 3 cm.

In some embodiments, the quartz window is substantially flat and has a diameter or length that is between about 40 cm and 100 cm.

In some embodiments, the quartz component is a quartz injector comprising one or more flow passages for introducing gas into the interior region of the plasma reactor and/or removing the gas from the interior region of the plasma reactor.

In some embodiments, the quartz component is a hollow dome.

In some embodiments, the protective layer has a thickness of between about 10 nm and 10 µm. The thickness may be an average thickness over a surface of the quartz component.

In some embodiments, the quartz component has a surface roughness, $R_a$, of between about 0.01 µm and 2 µm wherein the surface roughness is an average surface roughness over a surface of the quartz component.

In some embodiments, the protective layer has, on average, a porosity of less than about 1%.

In some embodiments, the protective layer comprises yttrium oxide crystallites having, on average, a largest cross-sectional dimension of between about 10 nm and 100 nm.

In some embodiments, the protective layer comprises at least about 90% by mass yttrium oxide.

In some embodiments, the protective layer comprises at least about 99% by mass yttrium oxide.

Provided herein is a method involving (a) receiving a quartz structure; and (b) coating the quartz structure with a protective layer comprising yttrium oxide to form a quartz component for a plasma reactor. The quartz component has a size and shape adapted for forming a part to be used in the plasma reactor.

In some embodiments, the protective layer does not substantially change the size or shape of the quartz structure.

In some embodiments, the method further involves installing the quartz component in the plasma reactor at a location where, during operation, a plasma will contact or be proximate to the quartz component.

In some embodiments, the plasma reactor is an etching tool, an ashing tool, and/or a deposition tool.

In some embodiments, the quartz component has a size and shape to serve as a window between a plasma source located exterior to the plasma reactor and an interior region of the plasma reactor.

In some embodiments, wherein the quartz component is a quartz window configured to be disposed in the plasma reactor at a position permitting radio frequency or microwave power from a radio frequency or microwave source to pass through the quartz window into an interior portion of the plasma reactor.

In some embodiments, the quartz window has a thickness of between 40 cm and 100 cm.

In some embodiments, the quartz component is a quartz injector comprising one or more flow passages for introducing gas into an interior portion of the plasma reactor and/or removing the gas from the interior portion of the plasma reactor.

In some embodiments, the protective layer has a thickness of between about 10 nm and 10 µm, wherein the thickness is an average thickness over a surface of the quartz component that, when installed, faces an interior region of the plasma reactor.

In some embodiments, the quartz component has a surface roughness, $R_a$, of between about 0.01 µm and 5 µm, wherein the surface roughness is an average surface roughness over a surface of the quartz component that, when installed, faces an interior region of the plasma reactor.

In some embodiments, the protective layer has, on average, a porosity of less than about 1%.

In some embodiments, the protective layer comprises yttrium oxide crystallites having, on average, a largest cross-sectional dimension of between about 10 nm and 100 nm.

In some embodiments, the protective layer comprises at least about 90% by mass yttrium oxide.

In some embodiments, the protective layer comprises at least about 99% by mass yttrium oxide.

In some embodiments, coating the quartz structure with a protective layer comprising yttrium oxide comprises depositing the protective layer by atomic layer deposition.

In some embodiments, the method further comprises roughening the protective layer, which may involve exposing the protective layer to deionized water. The deionized water has a temperature of between about 50° C. and 100° C.

BRIEF DESCRIPTION OF THE DRAWINGS

Numerous exemplary embodiments will now be described in greater detail with reference to the accompanying drawings. Other features, aspects, and advantages will become apparent from the description, the drawings, and the claims. Note that the relative dimensions of the following figures may not be drawn to scale unless specifically indicated as being scaled drawings.

DETAILED DESCRIPTION

The present disclosure generally relates to quartz components having quartz structures coated with a protective layer comprising, for example, yttrium oxide. The quartz components may be used in a plasma reactor. A quartz component often has a size and shape adapted for forming a window, port, or other component in a plasma reactor. A quartz component may be fabricated by coating a quartz structure with the protective layer. The coating process may include depositing a coating material such as yttrium oxide by a controllable process such as atomic layer deposition (ALD) or chemical vapor deposition (CVD), including plasma enhanced CVD (PECVD). In certain embodiments, the protective layer is thin with respect to the quartz component, such that the quartz component and the quartz structure have substantially the same size and shape, at least insofar as the quartz component serves as a part for a plasma reactor. In some embodiments, the disclosure concerns apparatus or systems, such as plasma reactors, containing a quartz component. The disclosure also concerns methods of making apparatus or systems such as plasma reactors by installing or otherwise providing quartz components in the apparatus or system.

Quartz components are sometimes etched or otherwise eroded by the reactors' plasma, particularly hydrogen-based plasmas. The erosion of a quartz component when exposed to a plasma can lead to various detrimental effects. However, in some cases, the mere removal of quartz is a relatively minor problem, particularly, if one considers the quartz component to be a consumable part of a plasma reactor. In such cases, after a certain amount of quartz is removed, the component is simply replaced with a new one and the apparatus is continued to be used for plasma-based reactions.

Figure 1:
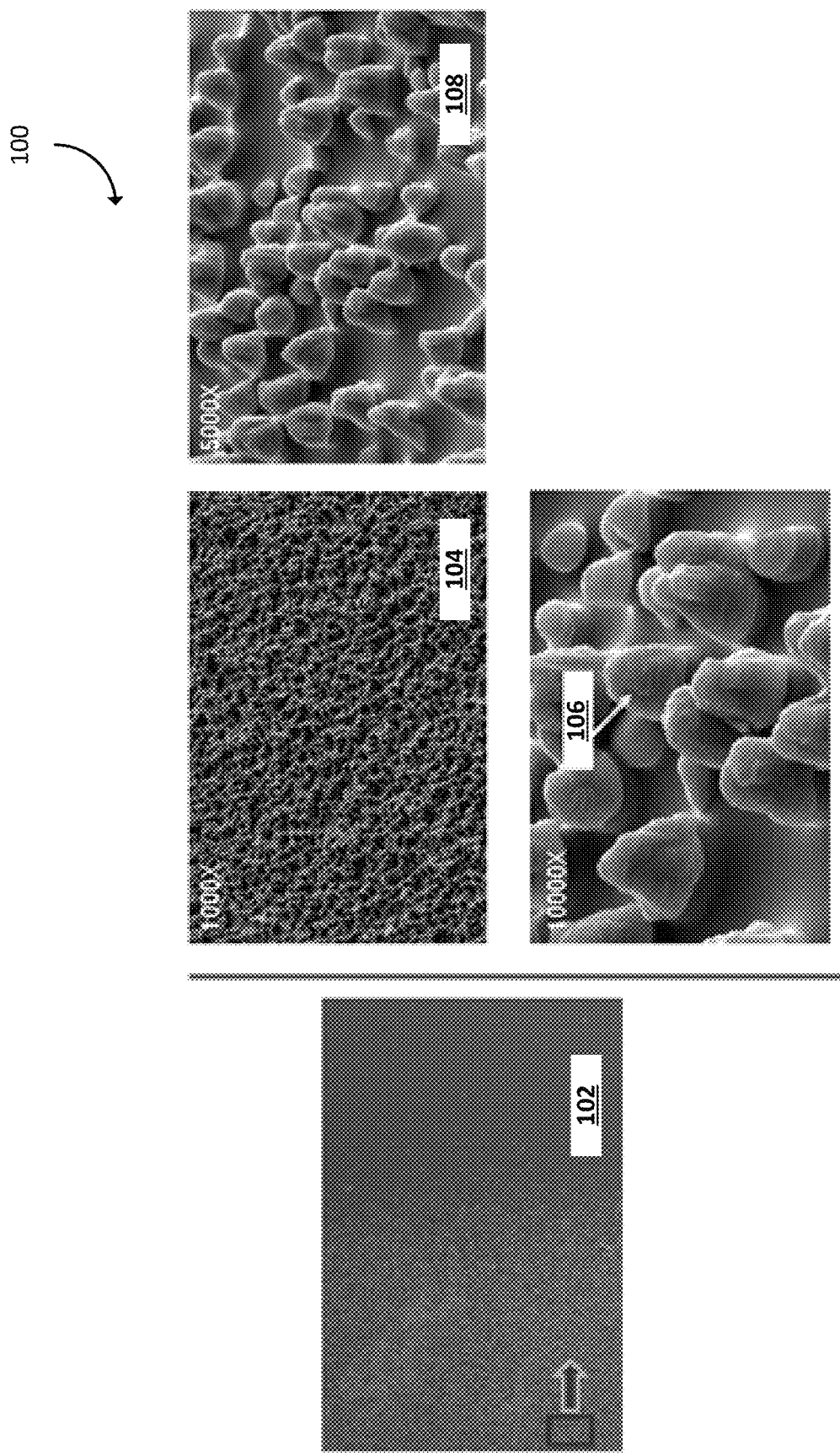
FIG. 1 presents a micrograph depicting microfeatures formed on a quartz component during exposure to a hydrogen-containing plasma.

The present inventors have found, however, that in some cases the erosion produces unstable microfeatures that can dislodge from the quartz component (such as, a window) and fall onto the substrate where electronic devices are being manufactured. In such cases, the microfeatures, and more particularly particles produced from such microfeatures, can destroy the electronic devices. Examples of damaging microfeatures on a quartz component are shown in the micrographs of FIG. 1.

While the unstable microfeatures can have a range of sizes, they are frequently in the range of about 1 µm to 50 µm in length with diameters up to about 10 µm, assuming a roughly cylindrical shape. They are large enough to produce defects on electronic devices being fabricated. If the plasma etching merely removed the quartz evenly over the surface of a window and did not produce the microfeatures, plasma etching of quartz would be a less significant problem.

Figure 5A:
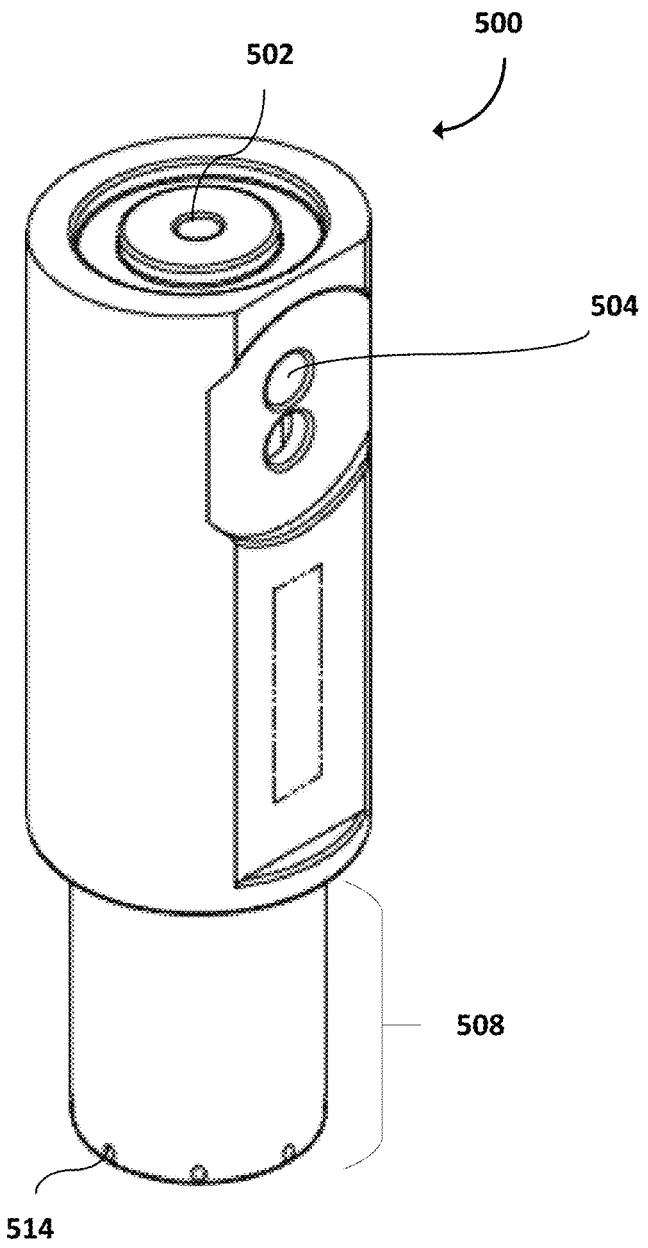
FIGS. 5A-B present perspective and cross-sectional views of a quartz injector for delivering gases to a plasma reactor.
Figure 5B:
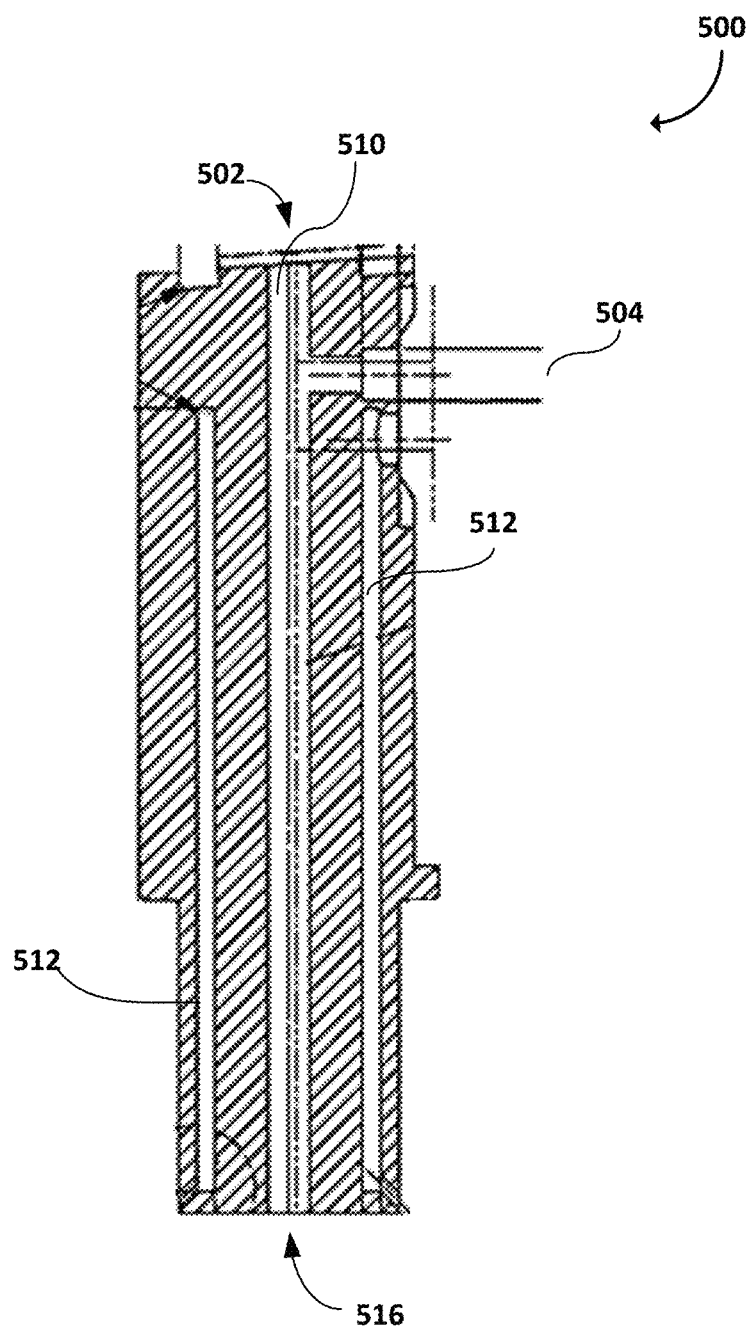

However, for some quartz components, the mere erosion of the quartz, regardless of the potential formation of unstable microfeatures, creates problems. For example, for quartz injectors with high-tolerance flow paths, described below, removal of even a small amount of quartz in a flow path can greatly change the hydrodynamics of the flow and negatively impact processes carried out in a plasma reactor. An example of a quartz injector with a sensitive flow path is shown in FIGS. 5A and 5B.

Unstable microfeatures sometimes form more easily or more prominently in regions of a quartz surface where the operating temperature is lower, e.g., about 20 C to 200 C. In regions exposed to higher temperatures, significantly fewer microfeatures are produced. While not wishing to be bound by theory, it is believed that such phenomena might result because higher temperatures cause silane ($SiH_4$) produced by the reaction of the hydrogen plasma with the silica (quartz) to decompose back to form silica. At lower temperatures, such decomposition might not occur, in which case the silane escapes and takes with it the silicon from the quartz, leaving behind silica in the microfeatures.

Definitions

It is to be understood that, as used herein, the term "semiconductor wafer" may refer both to wafers that are made of a semiconductor material, e.g., silicon, and wafers that are made of materials that are not generally identified as semiconductors, e.g., dielectrics and/or conductors, but that typically have semiconductor materials provided on them. Silicon on insulator (SOI) wafers are one such example. The apparatuses and methods described in this disclosure may be used in the processing of semiconductor wafers of multiple sizes, including 200 mm, 300 mm, and 450 mm diameter semiconductor wafers.

In this description, the term "plasma reactor" refers to a reactor that uses plasma during the processing of a substrate such as a partially fabricated semiconductor device, a display, or other electronic device. A plasma reactor may be a reactor that deposits material on a substrate (a "deposition reactor"), a reactor that etches material from a substrate (an "etcher" or "etching reactor"), a reactor that ashes photoresist or other material (an "asher"), etc. Examples of deposition reactors include plasma enhanced atomic layer deposition (PEALD) reactors and plasma enhanced chemical vapor deposition (PECVD) reactors. Examples of etch chambers include various etch tools for etching conductors and/or dielectrics in a plasma-assisted process. Examples of Lam Research Corporation semiconductor device fabrication tools that use quartz windows that may be exposed to plasma, and particularly hydrogen plasma, are the KIYO®, the GAMMA®, and the STRIKER®.

A "plasma source" is a source of power for generating a plasma within a plasma reactor. Typically in the context of this disclosure a plasma source is located on the exterior of the plasma reactor and a quartz window is located between the plasma source and the interior of the plasma reactor. The interior of the plasma reactor is where the plasma is formed and the wafer or other workpiece is located. The plasma source may provide power in any of many particular frequencies or ranges of frequencies. In certain embodiments, the plasma source delivers power in the radio frequency portion of the electromagnetic spectrum. In certain embodiments, the plasma source delivers power in the microwave frequency portion of the electromagnetic spectrum. The plasma source may include a plate, a coil or other structure that is energized, during operation, to produce the power for generating the plasma in the interior of the plasma reactor. Examples of plasma sources are presented in a few examples presented below.

In some implementations, the plasma reactor is a part of a multi-station semiconductor processing system. In such implementations, each process chamber may include a substrate holder and, optionally, one or more chamber windows, and/or plasma sources.

A "quartz component" is a quartz-containing component of a plasma reactor. Quartz is a form of silicon dioxide ($SiO_2$) containing silicon and oxygen atoms in a continuous framework of silicon-oxygen tetrahedra, where each oxygen atom is shared between two tetrahedra. Examples of quartz components include quartz windows and quartz injectors. Quartz windows may be used to transmit radio frequency power to the reactor interior from a radio frequency source located outside the reactor interior. The reactor interior is where a substrate is located and processed by a reaction facilitated by the plasma. Quartz injectors are quartz elements containing one or more flow paths for delivering one or more gases into or removing one or more gases out of a plasma reactor interior. In certain embodiments, quartz injectors may have particularly intricate flow passages machined into the structure of the port.

"Unstable microfeatures" are small features that may form on quartz surfaces that contact plasmas, particularly hydrogen-containing plasmas. In certain embodiments, unstable quartz cylindrical microfeatures are between about a few micrometers up to tens of micrometers in size (cross-section and/or length) and they can be easily dislodged from the quartz surface during normal operation of a plasma reactor. Simple vibration or other weak mechanical force, for example, can dislodge the microfeatures.

A "protective layer" is a layer formed on a quartz component. The protective layer may reduce removal of quartz from the quartz component when exposed to a plasma or other aggressive environment such as a physically or chemically aggressive environment. In one example, the protective layer is or includes a yttrium oxide layer. The protective layer may be formed in a coating apparatus that deposits the protective layer on a quartz component. The coating apparatus may employ various well-known deposition processes such as ALD, CVD, sputtering, or other chemical or physical process to form the protective layer on the quartz component.

Certain Functions of Protective Layers on Quartz Components

In various embodiments, a protective layer is provided on a quartz component. The protective layer may prevent or reduce formation of unstable microfeatures by exposure to plasma, and particularly hydrogen-containing plasma or other aggressive environment. Further or alternatively, the protective layer may prevent or reduce erosion of quartz by exposure to plasma, and particularly hydrogen-containing plasma or other aggressive environments. As a consequence, unstable microfeatures do not flake off from quartz component surfaces and do not degrade the electronic devices being fabricated. In some cases, quartz components need not be replaced as frequently because they degrade more slowly, if at all. Further, in the case of quartz components having features with tight tolerances, such as some quartz injectors, the properties of the features are preserved during exposure to plasma, and therefore the functioning of the quartz component remains as intended, at least for a longer period of operation than in the case of a quartz component without a protective layer. In certain embodiments, the protective layer is yttrium oxide.

Apparatus Having Quartz Components

As introduced and discussed earlier, a protective layer is provided on a quartz component, which may be inserted into or otherwise integrated with a plasma reactor, such as a transformer coupled plasma (TCP), sometimes referred to as an inductively coupled plasma (ICP), apparatus.

Figure 2:
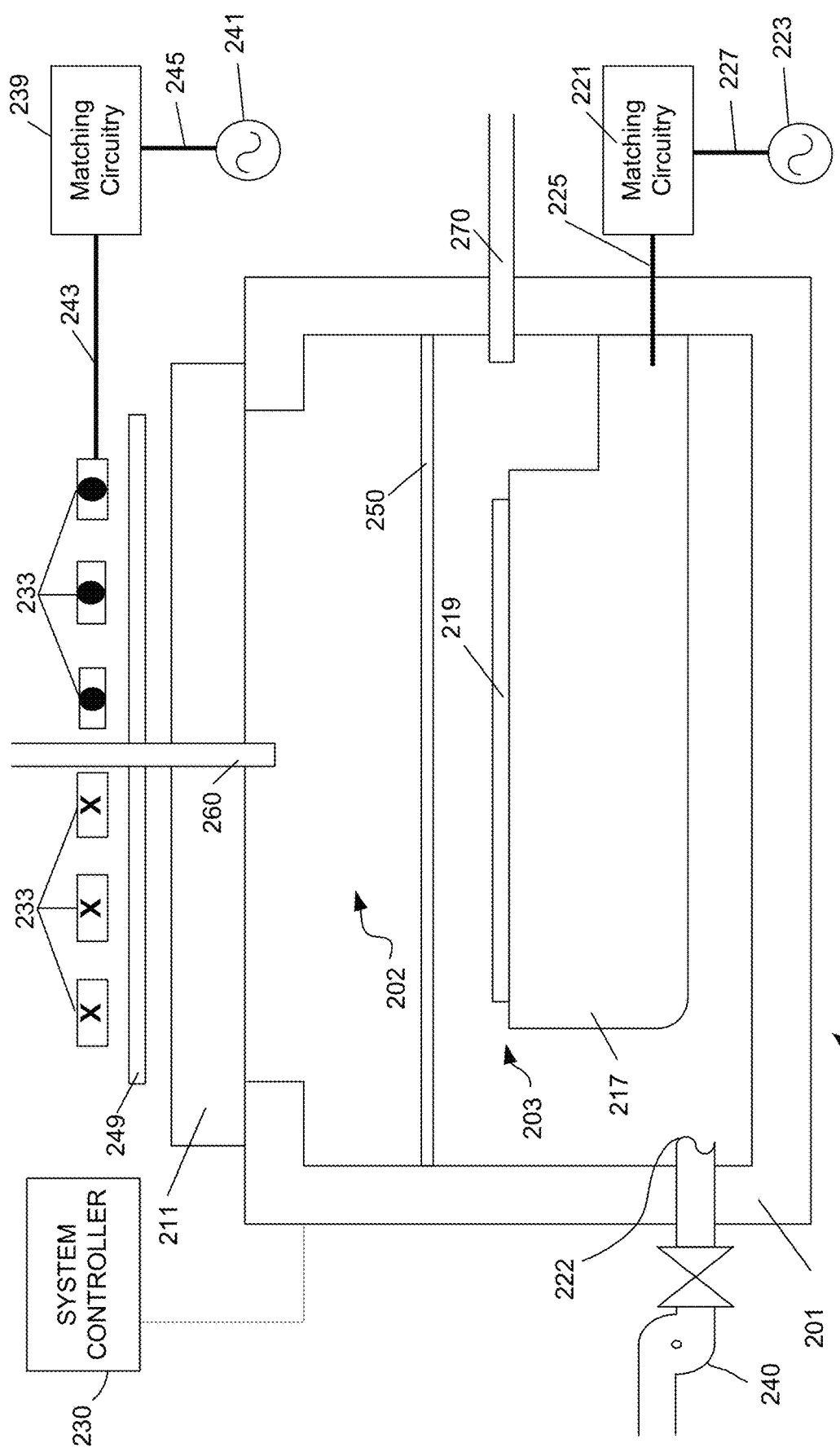
FIG. 2 presents a schematic view of remote plasma reactor.

FIG. 2 schematically shows a cross-sectional view of an ICP etching apparatus 200 appropriate for implementing certain embodiments herein, an example of which is a KIYO® reactor, produced by Lam Research Corp. of Fremont, Calif. The inductively coupled plasma apparatus 200 includes a process chamber 201 structurally defined by chamber walls and a window 211. The chamber walls 201 may be fabricated from stainless steel or aluminum. The window 211 may be a quartz component as described herein. For example, in certain embodiments, at least interior-facing surfaces of the window 211 may contain a protective layer as discussed herein. The protective layer may protect the window 211 from forming microfeatures or otherwise degrading when exposed to an aggressive environment. Other components of the apparatus may be quartz components with protective layers as described herein.

An optional internal plasma grid 240 divides the overall processing chamber 201 into an upper sub-chamber 202 and a lower sub-chamber 203. In certain embodiments, plasma grid 240 is not present. A chuck 217 is positioned within the lower sub-chamber 203 near the bottom of the apparatus. The chuck 217 is configured to receive and hold a semiconductor wafer 219 upon which the etching and/or deposition processes are performed. The chuck 217 can be an electrostatic chuck for supporting the wafer 219 when present. In some embodiments, an edge ring (not shown) surrounds the chuck 217, and has an upper surface that is approximately planar with a top surface of a wafer 219, when present over chuck 217. The chuck 217 may also include electrostatic electrodes for chucking and de-chucking the wafer 219. A filter and DC clamp power supply (not shown in FIG. 2) may be provided for this purpose. Other control systems for lifting the wafer 219 off the chuck 217 may be provided.

The chuck 217 can be electrically charged using an RF power supply 223. The RF power supply 223 is connected to matching circuitry 221 through a connection 227. Bias power may be delivered to the chuck 217 to bias the substrate. In various embodiments, the bias power may be set to a value between 0V (no bias) and about 2000V, or between 0V and about 1800V, or between 0V and about 1400V, or between about 400V and about 1400V. The matching circuitry 221 is connected to the chuck 217 through a connection 224. In this manner, the RF power supply 223 is connected to the chuck 217.

The chuck 217 disclosed herein may operate at temperatures ranging between about −200° C. and about 600° C. or between about −20° C. and about 240° C. for processing a substrate to etch tantalum, the chuck 217 may be set at a temperature less than about 0° C. The temperature will depend on the process operation and specific recipe and the tool used.

Elements for plasma generation (collectively a plasma source) include a coil 233 is positioned above window 211. In some embodiments, a coil is not used. The coil 233 is fabricated from an electrically conductive material and includes at least one complete turn. The example of a coil 233 shown in FIG. 2 includes three turns. The cross-sections of coil 233 are shown with symbols, and coils having an "X" extend rotationally into the page, while coils having a "•" extend rotationally out of the page. Elements for plasma generation also include an RF power supply 241 configured to supply RF power to the coil 233. In general, the RF power supply 241 is connected to matching circuitry 239 through a connection 244. The matching circuitry 239 is connected to the coil 233 through a connection 243. In this manner, the RF power supply 241 is connected to the coil 233. The RF power supply 241 may be configured to be pulsed at a frequency between about 10 Hz and about 200 Hz using a duty cycle between about 1% and about 20% during the modification operation, and/or pulsed at a frequency between about 10 Hz and about 200 Hz using a duty cycle between about 1% and about 20%. An optional Faraday shield 249 is positioned between the coil 233 and the window 211. The Faraday shield 249 is maintained in a spaced apart relationship relative to the coil 233. The Faraday shield 249 is disposed immediately above the window 211. The coil 233, the Faraday shield 249, and the window 211 are each configured to be substantially parallel to one another. The Faraday shield 249 may prevent metal or other species from depositing on the window 211 of the processing chamber 201.

Process gases (e.g., chlorine, argon, oxygen, etc.) may be flowed into the processing chamber 201 through one or more main gas flow inlet 260 positioned in the upper chamber 202 and/or through one or more side gas flow inlets 270. A vacuum pump, e.g., a one or two stage mechanical dry pump and/or turbomolecular pump 240, may be used to draw process gases out of the processing chamber 201 and to maintain a specified pressure or pressure range within the processing chamber 201. For example, the pump may be used to evacuate the processing chamber 201 during a purge operation. A valve-controlled conduit may be used to fluidically connect the vacuum pump to the processing chamber 201 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 260 and/or 270. In certain embodiments, process gas may be supplied only through the main gas flow inlet 260, or only through the side gas flow inlet 270. In some cases, the gas flow inlets shown in the figure may be replaced with more complex gas flow inlets, one or more showerheads, for example. The Faraday shield 249 and/or optional grid 240 may include internal channels and holes that allow delivery of process gases to the processing chamber 201. Either or both of Faraday shield 249 and optional grid 240 may serve as a showerhead for delivery of process gases. In some embodiments, a liquid vaporization and delivery system may be situated upstream of the processing chamber 201, such that once a liquid reactant or precursor is vaporized, the vaporized reactant or precursor is introduced into the processing chamber 201 via a gas flow inlet 260 and/or 270. Example liquid precursors include $SiCl_4$ and silicon amides.

Radio frequency power is supplied from the RF power supply 241 to the coil 233 to cause an RF current to flow through the coil 233. The RF current flowing through the coil 233 generates an electromagnetic field about the coil 233. The electromagnetic field generates an inductive current within the upper sub-chamber 202. The physical and chemical interactions of various generated ions and radicals with the wafer 219 may selectively etch features of and/or deposit layers on the wafer 219.

Processing chamber 201 may be coupled to facilities (not shown) when installed in a clean room or a fabrication facility. Facilities include plumbing that provide processing gases, vacuum, temperature control, and environmental particle control. These facilities are coupled to processing chamber 201, when installed in the target fabrication facility. Additionally, processing chamber 201 may be coupled to a transfer chamber that allows robotics to transfer semiconductor wafers into and out of processing chamber 201 using typical automation.

In some embodiments, a system controller 230 (which may include one or more physical or logical controllers) controls some or all of the operations of a processing chamber. The system controller 230 may include one or more memory devices and one or more processors. In some embodiments, the apparatus includes a switching system for controlling flow rates and durations when disclosed embodiments are performed. In some embodiments, the apparatus may have a switching time of up to about 200 ms, or up to about 740 ms. Switching time may depend on the flow chemistry, recipe chosen, reactor architecture, and other factors.

In some implementations, a controller 230 is part of a system, which may be part of the above-described examples. Such systems can comprise semiconductor processing equipment, including a processing tool or tools, chamber or chambers, a platform or platforms for processing, and/or specific processing components (a wafer substrate support, a gas flow system, etc.). These systems may be integrated with electronics for controlling their operation before, during, and after processing of a semiconductor wafer or substrate. The electronics may be referred to as the "controller," which may control various components or subparts of the system or systems. The controller 230, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

In certain embodiments, a quartz window such as window 211 has a length (if rectangular) or diameter (if circular) of, on average, between about 40 cm and 90 cm. In certain embodiments, a quartz window has a thickness (inner surface to outer surface) of, on average, between about 20 mm and 60 mm. These values may be appropriate for processing 300 mm diameter wafers. For 200 mm wafers, it may be appropriate to scale the diameter by dividing by a factor of 1.5. For 450 mm wafers, it may be appropriate to scale the diameter by multiplying by a factor of 1.5. In certain embodiments, a quartz window has a substantially flat shape.

In some embodiments, the quartz component is a port configured to flow a process gas into or out of a plasma reactor. The quartz injector has a protective layer, as described herein, on at least a portion of the port that comes into contact with a plasma or other aggressive environment in reactor. In certain embodiments, the port is installed at or near the center of a quartz window such as window 211 of FIG. 2. For example, gas flow inlet 260 may be a quartz injector with a protective layer.

Figure 3:
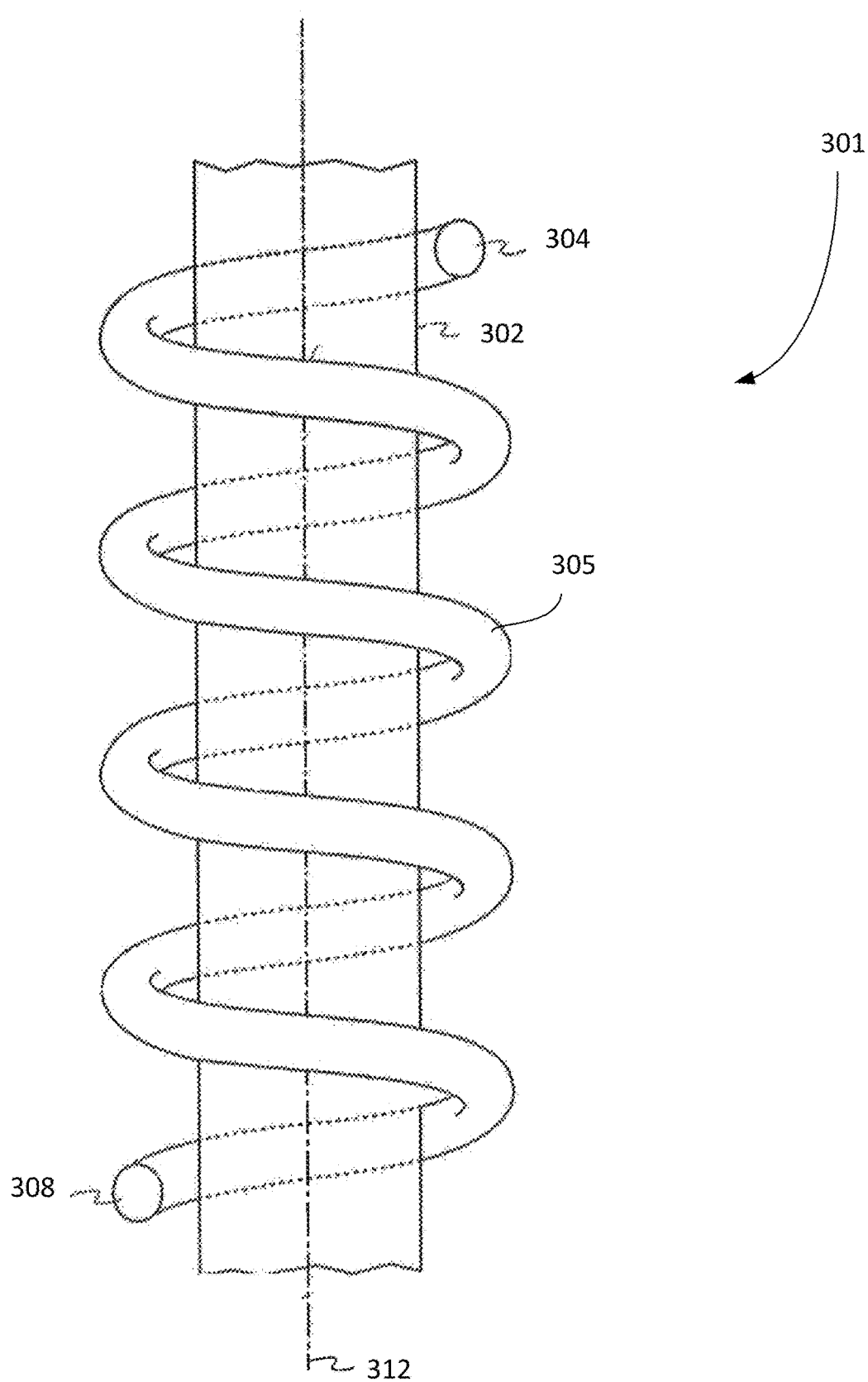
FIG. 3 presents a schematic view of a microwave plasma source for a plasma reactor.

In some embodiments, the quartz component is a quartz tube. In one example, a quartz tube is employed in a microwave plasma source suitable for providing plasma. As illustrated in FIG. 3, a portion 301 of a microwave plasma source includes a quartz tube 302 and coiled cooling tube 305 having a cooling fluid inlet 304 and outlet 308. Not shown in this figure are a microwave generator (e.g., a magnetron), a waveguide to transmit microwave radiation from the generator to the quartz tube 302, and an optional microwave cavity surrounding the quartz tube 302. In this context, the quartz tube 302 is sometimes referred to as a plasma discharge tube. During operation, a process gas flows into quartz tube 302 where the gas (e.g., a hydrogen-containing gas) is excited to a plasma by interaction with microwaves traveling in a direction along an axis 312. The resulting plasma is used by a reactor to process a substrate. An example of a microwave plasma source is provided in US Patent Application Publication No. 2015/0318148 A1, which is incorporated herein by reference in its entirety.

Figure 4:
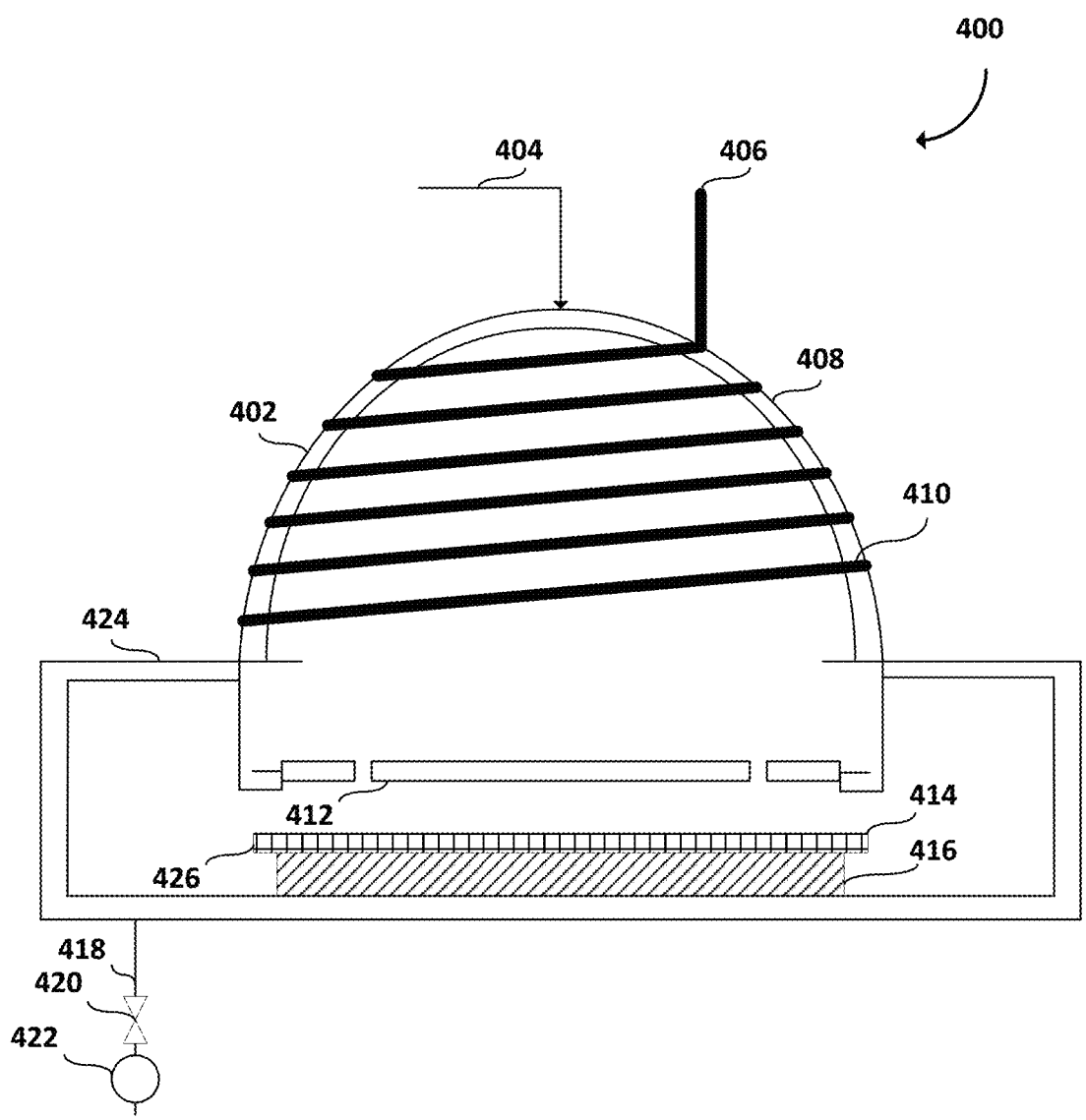
FIG. 4 presents a schematic view of a TCP plasma reactor.

In some embodiments, the quartz component is a quartz dome. In one example, a quartz dome is employed in a plasma reactor 400 suitable for producing a remote plasma. See FIG. 4. In the depicted embodiment, the reactor 400 is an indirect or "remote" type of plasma tool in which a quartz window 402 generally has the shape of a dome. Wrapped around the dome are electrically conductive induction coils 410 that may be activated, or powered, to generate a plasma in certain regions within the dome-shaped quartz window 402. A commercially available tool that generally conforms to the embodiment of FIG. 4 is the GAMMA® reactor provided by Lam Research Corp.

In certain embodiments, reactor 400—as also shown and described in "Characterization of hydrogen-plasma interactions with photoresist, silicon, and silicon nitride surfaces" by Thedjoisworo et al., J. Vac. Sci. Technol. A, Vol. 30, No. 3, May/June 2012, incorporated herein by reference in its entirety—includes three primary components: (1) plasma source 408, (2) showerhead 412, and (3) reaction chamber 424. The plasma source 408 may collectively refer to the dome-shaped quartz window 402 surrounded by induction coils 410, which are powered by a radio frequency (RF) power supply. In certain embodiments, hydrogen ($H_2$) gas, e.g., having a purity level of approximately 99.9995%, is introduced via a designated inlet into the plasma source 408. The induction coils 410 may then be subsequently energized to generate a hydrogen-derived plasma inside the dome-shaped quartz window 402.

Active species generated in the plasma may be flowed from the quartz window 402 toward a surface 414 of a wafer 426 via a showerhead 412. The wafer 426 is disposed on a platen 416. In certain embodiments, the showerhead 412 may be constructed as a metal plate with holes. The showerhead 412 both (a) protects the wafer 426 from being directly exposed to plasma contained within the dome-shaped quartz window 402 and (b) induces recombination of ions and electrons, all of which shield the wafer surface 414 from bombardment therefrom. Further, the showerhead 412 may be grounded to conduct electrically charged species, e.g., ions, electrons, away from the plasma. Accordingly, the showerhead 412 may create remote or downstream plasma processing conditions that allow primarily neutral species, such as H radicals, to move through the showerhead 412 holes and reach the wafer surface 414.

The showerhead 412 may distribute active species from the plasma over a relatively large area, and thus supplement the uniformity of gas distribution over the entirety of the wafer surface 414. Contained within the reaction chamber 424, the wafer 426 rests upon the platen 416, which may be configured to be outfitted with a heating element that allows for temperature of the wafer 426 to be varied. The platen 416 temperature may be controlled by thermocouples attached to the platen 416 and a temperature controller.

Under typical operational conditions, the platen 416 may be first heated to approach a desired temperature set point. Hydrogen gas may then be introduced to the reactor 400, and the pressure in reaction chamber 424 may be dropped, e.g., by operating a vacuum pump to attain a desired pressure. RF power may next be activated to generate the hydrogen-derived plasma and initiate etch of or deposition on the wafer 426.

In certain embodiments, a quartz dome has a height (axial distance from the opening of the hollow region to the tip of the dome) of, on average, between about 15 cm and 30 cm. In certain embodiments, a quartz dome has a diameter at the bottom or opening of the structure of, on average, between about 20 cm and 45 cm. In certain embodiments, a quartz dome has a thickness (inner surface to outer surface) of, on average, between about 5 mm and 15 mm.

An example of a quartz injector is illustrated in FIGS. 5A-B, with FIG. 5A showing a perspective view and FIG. 5B showing a cross-sectional view. As shown in the Figures, a quartz injector 500 includes a bottom portion 508 that, when installed in a plasma reactor, extends into the reactor interior. Additionally, injector 500 includes gas inlets 502 and 504 and outlets 514 and 516. Injector 500 also includes carefully machined flow paths 510 (a central flow path) and 512 (a circumferential flow path). Together these paths provide precisely controlled gas flow. Unfortunately, if either flow path or its entrance or exit is modified even slightly, the properties of the flowing gas can significantly deviate from the intended flow.

In certain embodiments, a quartz injector has a length, generally in the direction of the flow path, of, on average, between about 5 cm and 10 cm. In certain embodiments, a quartz injector has a diameter or largest transverse dimension, in a direction generally perpendicular to the flow path, of, on average, between about 2 cm and 4 cm. In certain embodiments, the flow path or paths in a quartz injector have a diameter or largest transverse dimension, in a direction generally perpendicular to the direction of flow, of, on average, between about 5 mm and 15 mm.

While the above discussion has focused on quartz components installed in plasma reactors, particularly reactors for processing semiconductor wafers, the disclosed embodiments include uninstalled quartz components for use in plasma reactors and in other apparatus such as plasma chambers for scientific research and other purposes that do not necessarily involve reactions with plasma. Some or all components of a plasma apparatus may exhibit longer service lives than their quartz components. In such cases, the quartz components may be used to retrofit or refurbish plasma reactors or other apparatus. In other words, the quartz components may be used as replaceable or spare parts. In some cases, the quartz components may be provided in combination with other consumable parts, e.g., substrate pedestals and/or showerheads, as part of a kit for retrofitting or refurbishing a plasma apparatus.

The Protective Layer

As mentioned, to address the various challenges associated with the erosion of quartz surfaces during plasma, e.g., hydrogen-derived or hydrogen-based plasma, processing, a protective layer or coating is provided on the surface of a quartz structure. A quartz component includes a quartz structure that is solely or primarily quartz and a protective coating, disposed on the quartz structure, that reduces the rate of consumption or degradation of the quartz component during operation of a plasma reactor. As a result, microfeatures are less likely to form on and ultimately dislodge from surfaces of the quartz component exposed to a plasma during processing within a reaction chamber.

Figure 6A:
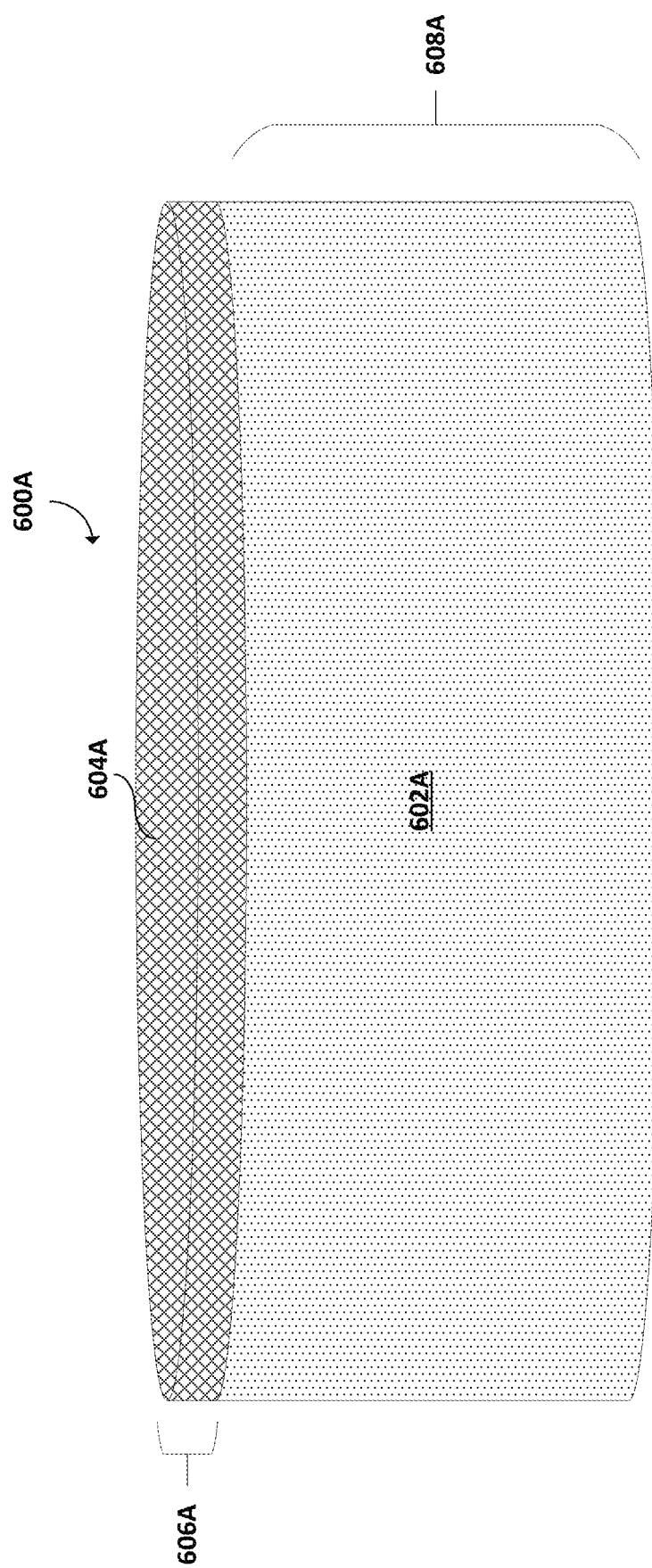
FIG. 6A presents a schematic view of a simple quartz component, such as a quartz window, with a protective layer.

FIG. 6A provides a schematic diagram of a quartz component 600A that includes a quartz structure 602A coated with a protective layer 604A having a defined thickness 606A. The thickness 606A of the protective layer 604A is exaggerated relative to the thickness 608A of quartz structure 602A. One skilled in the art will appreciate that such exaggeration is for explanatory purposes and that other suitable orientations, relative thicknesses, or configurations of the protective layer 604A relative to the quartz structure 602A may exist without departing from the purpose of the protective layer 604A in preventing the formation of microfeatures on the quartz component 600A.

Figure 6B:
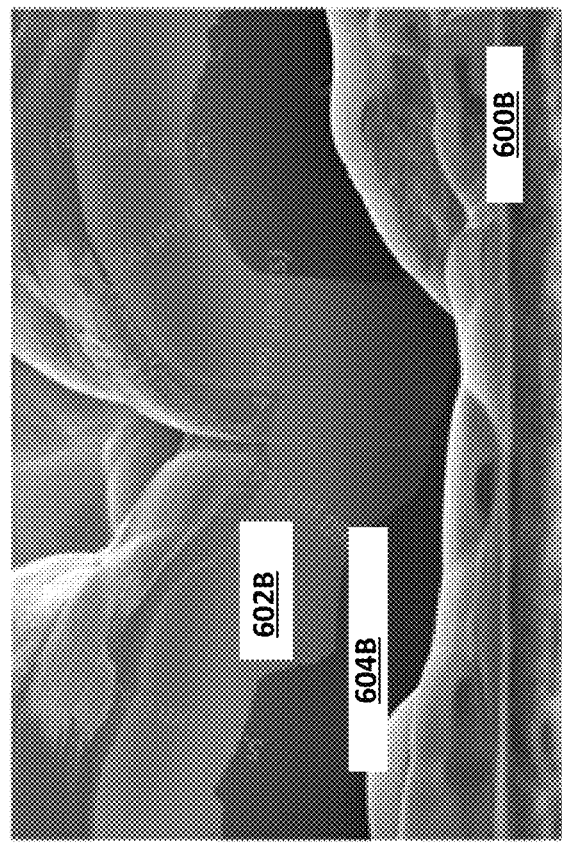
FIG. 6B presents a micrograph view of a quartz layer on which a protective layer containing yttrium oxide is disposed.
Figure 6B:
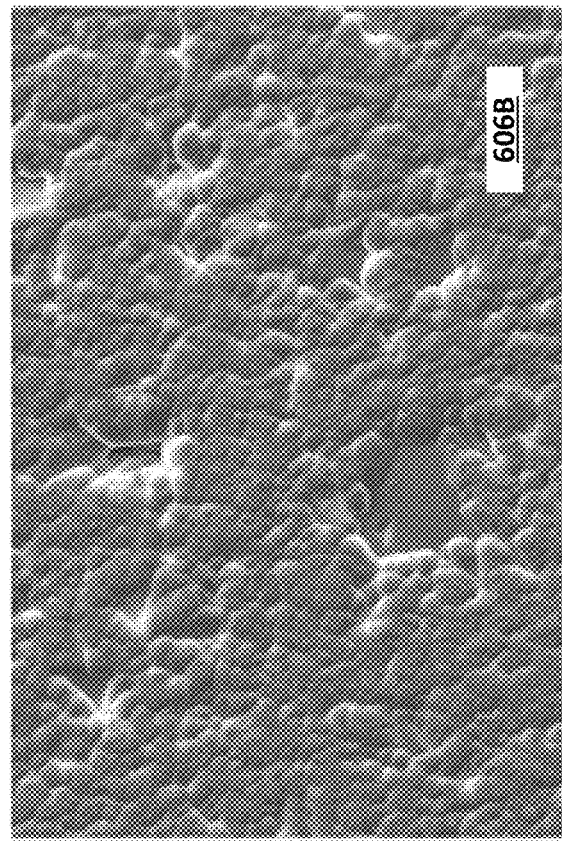

FIG. 6B provides a micrograph of a quartz component cross-section 600B having a quartz structure 604B coated with a yttrium oxide protective layer 602B. As shown in FIG. 6B, the yttrium oxide protective layer 602B conformally coats the quartz structure 604B. In FIG. 6B, micrograph 606B shows a top view of the quartz component, and particularly the conformally applied yttrium oxide protective layer. In certain embodiments, the protective layer conformally coats an irregular (on the scale of the thickness of the protective layer thickness) surface of the quartz structure. As shown in FIG. 6B, the protective layer 602B follows the contours of pits or recesses on the surface of the quartz structure 604B.

In certain embodiments, the protective layer includes yttrium oxide (e.g., $Y_2O_3$). Examples of beneficial properties associated with yttrium oxide include: (1) stability against attack by energetic or reactive species such as H radicals generated by, or associated with, hydrogen ($H_2$)-based plasma; (2) preserving many of the benefits of quartz as a desirable radio frequency (RF) or microwave (MW) coupling material, including (but not limited to): low RF loss low thermal expansion, low thermomechanical stress, and flexibility in application to parts or components of various sizes; (3) compatibility with many of the process gases commonly used for plasma-based etching; and (4) ability to exist as a conformal, uniform and dense coating, e.g., as shown in the micrograph of FIG. 6B.

In certain embodiments, the protective layer contains at least about 90% by mass yttrium oxide, or at least about 99% by mass yttrium oxide. Trace elements that may be present include sodium, magnesium, aluminum, etc. In certain embodiments, the protective layer is made from a material other than yttrium oxide. Examples of such other materials include oxides and fluorides of other rare earth elements, e.g., YOxFy oxyflourides (x=0-1.5, y=0-3)

In certain embodiments, the protective layer may comprise multiple striated layers of yttrium oxide or other material, with each subsequent striated layer having a lesser or lower density that the original, or initial, yttrium oxide layer. Later-deposited striated layers may also demonstrate higher levels of porosity than the original layer.

Yttrium oxide protective layers suitable for application on quartz structures may have a porosity of at least about 95%, or between about 98% and 100%. The material of the protective layer may be amorphous, crystalline, microcrystalline, etc., or combinations of any two or more of such morphologies. In certain embodiments, the protective layer contains crystallites having a mean diameter (or other longest dimension) of between about 10 nm and 100 nm (e.g., between about 30 nm and 70 nm). In some cases, a yttrium oxide protective layer is polycrystalline with crystallites being cubic (440) and elongated (e.g., about 50 nm length and about 30 nm width). In certain embodiments, the protective layer has a thickness of between about 100 nm and 50 μm (e.g., between about 0.5 μm and 30 μm). In certain embodiments, a protective layer has a surface roughness ($R_a$) of between about 0.03 μm and 0.3 μm.

Method of Forming the Protective Layer on a Quartz Component

As mentioned, a quartz component may be fabricated by coating a quartz structure with a protective layer. The coating process may include depositing a coating material such as yttrium oxide by a controllable process such as atomic layer deposition (ALD) or chemical vapor deposition (CVD), including plasma enhanced CVD (PECVD).

Figure 7A:
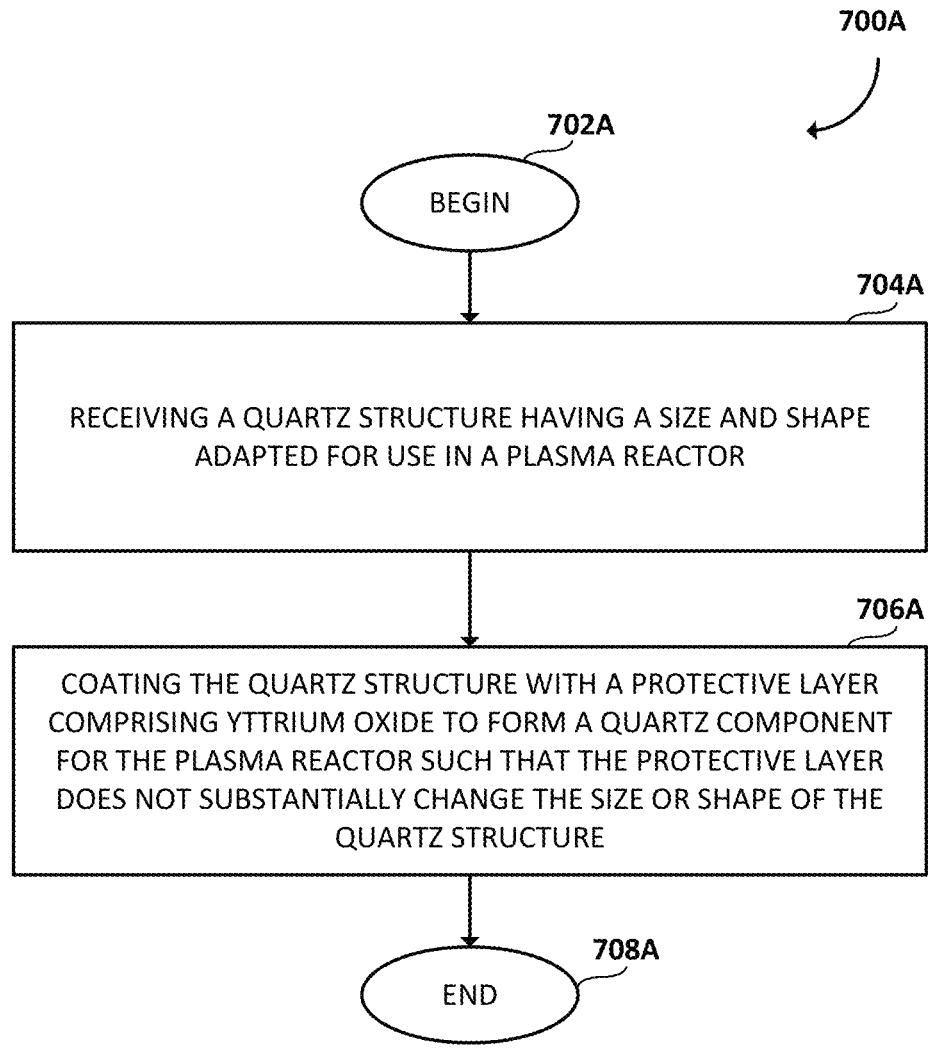
FIGS. 7A and 7B present flow charts of processes for forming a protective layer on a quartz component, with the option of texturing the surface of the deposited protective layer.

An exemplary process flow 700A describing deposition of a coating material comprising yttrium oxide on a quartz structure is shown in FIG. 7A. Process flow 700A initiates at a "begin" operation 702A leading to operation 704A, where a quartz structure having a size and shape adapted for use in a plasma reactor is received therein. Suitable examples of such quartz structures may include the quartz injectors and other quartz components, illustrated in FIGS. 2, 3A-C, 4, and 5A and 5B. Next, at operation 706A, the quartz structure contained within the plasma reactor is coated with a protective layer comprising yttrium oxide by ALD, described further herein, to form a quartz component for the plasma reactor. The protective layer does not substantially change the size or shape of the quartz structure. Upon completion of operation 706A, process flow 700A concludes as illustrated in operation 708A. One skilled in the art will appreciate that operations 702A-708A are exemplary and not intended to be restrictive, and that other suitable variants of that shown in process flow 700A may exist without departing from the scope and spirit of fabricating a quartz component.

In certain embodiments, the deposition process is ALD, which is a technique that deposits thin layers of material using sequential self-limiting reactions. ALD processes use surface-mediated deposition reactions to deposit films on a layer-by-layer basis with each layer formed by a single completed cycle. An ALD cycle may include the following operations: (i) delivery/adsorption of a precursor, (ii) purging of precursor from the reaction chamber, (iii) delivery of a second reactant and optionally igniting plasma within the reaction chamber, and (iv) purging of byproducts from the reaction chamber. The reaction between the second reactant and the adsorbed precursor to form a film on the surface of a substrate affects the film composition and properties, such as nonuniformity, stress, wet etch rate, dry etch rate, electrical properties (e.g., breakdown voltage and leakage current), etc.

In one example of an ALD process, a quartz surface that includes a population of surface active sites is exposed to a gas phase distribution of a first precursor, such as an yttrium-containing precursor, in a dose provided to a chamber housing a quartz structure. Molecules of this first precursor are adsorbed onto the surface, including chemisorbed species and/or physisorbed molecules of the first precursor. It should be understood that when a compound is adsorbed onto the substrate surface as described herein, the adsorbed layer may include the compound as well as derivatives of the compound. For example, an adsorbed layer of a yttrium-containing precursor may include the yttrium-containing precursor as well as derivatives of the yttrium-containing precursor. After a first precursor dose, the chamber is then evacuated to remove most or all of first precursor remaining in gas phase so that mostly or only the adsorbed species remain. In some implementations, the chamber may not be fully evacuated. For example, the reaction chamber may be evacuated such that the partial pressure of the first precursor in gas phase is sufficiently low that substantially no reaction occurs. A second reactant, such as an oxygen-containing gas, is introduced to the chamber so that some of these molecules react with the first precursor adsorbed on the surface. In some processes, the second reactant reacts immediately upon contact with the adsorbed first precursor. In other embodiments, the second reactant reacts only after an activation is applied (e.g., contact with a plasma, UV radiation, and/or thermal energy). The chamber may then be evacuated again to remove unbound second reactant molecules. As described above, in some embodiments the chamber may not be completely evacuated. Typically, several ALD cycles are conducted consecutively to form a film to a desired thickness.

In some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

In certain embodiments, precursors used in synthesizing a yttrium oxide protective layer include tris(methylcyclopentadienyl) yttrium, although other suitable precursors may also be used and may be formed onto exposed quartz surfaces via cyclic ALD processes conducted at approximately 200° C. to 450° C.

ALD precursors suitable for use in formation of a yttrium oxide protective layer may include one or more of the following properties:

controllable volatility (e.g., for efficient transportation of precursor species, e.g., a rough limit of about 0.1 Torr vapor pressure at the maximum applicable source temperature);

no self-decomposition (e.g., to prevent against the destruction of the self-limiting film growth mechanism);

aggressive and complete reactions (e.g., to provide fast completion of the surface reaction and thereby contribute to short cycle times, provide higher film purity, and to avoid complications otherwise often associated with incomplete gas phase reactions);

no etching of the film or substrate material to ensure no competing reaction pathways that would prevent film growth;

no dissolution to the film (e.g., that would destroy the self-limiting film growth mechanism);

unreactive byproducts to avoid corrosion of the film, and to avoid a decrease in film growth rate as caused by byproduct re-adsorption; and sufficient purity to meet the tolerances and performance expectations specific to each process.

Although tris(methylcyclopentadienyl)yttrium is envisioned as a precursor to form the yttrium oxide protective layer, other cyclopentadienyls precursors such as tris(cyclopentadienyl)yttrium(III) and tris(butylcyclopentadienyl)yttrium may be used in combination with water ($H_2O$) employed to drive off precursor ligands as needed. In certain embodiments, β-diketonates such as yttrium(III) tris(2,2,6,6-tetramethyl-3,5-heptanedionate), yttrium(III) hexafluoroacetylacetonate dehydrate, and yttrium(III) acetylacetonate hydrate may be used as an alternative to the mentioned cyclopentadienyls in combination with water.

The general synthetic procedure for forming a one-micron thick layer of yttrium oxide on a quartz surface may proceed substantially as follows: (1) a hydroxyl (—OH) terminated quartz starting surface is provided; (2) yttrium-containing (e.g., $Y(L)_3$) species are injected onto the starting surface to react therewith to form a yttrium-containing monolayer; (3) optional purge; (4) water ($H_2O$) is injected to drive off yttrium-containing precursor ligands to leave behind a layer of yttrium oxide. Steps (1)-(4) are repeated as necessary to form the yttrium oxide layer to a desired thickness. In certain embodiments, about 8,000 cycles are performed to deposit a one-micron thick film of yttrium oxide.

In certain embodiments, a 100 nm-5,000 nm thick yttrium oxide coating can be deposited in a hot-wall ALD reactor of sufficient size to hold one or more quartz parts, such as a window, a dome and/or a port. The yttrium precursor and water can be introduced into the reaction chamber sequentially. In certain embodiments, pumping functionality may be integrated with a precursor switch (e.g., responsible for precursor delivery into the reaction chamber) to assist with precursor evacuation, and to prevent the precursor from cross-talking; i.e., the gases employed in an ALD cycle do not interact and potentially breakdown in an unwanted fashion or prematurely. Cross-talk can lead to a more CVD-like deposition.

Self-limiting ALD processes responsible for forming the yttrium oxide protective layer may be conducted at a temperature of about 150° C.-500° C. After coating of ALD to a specific thickness, the ALD-coated quartz parts may be used in a variety of reaction chambers for many different applications.

Figure 7B:
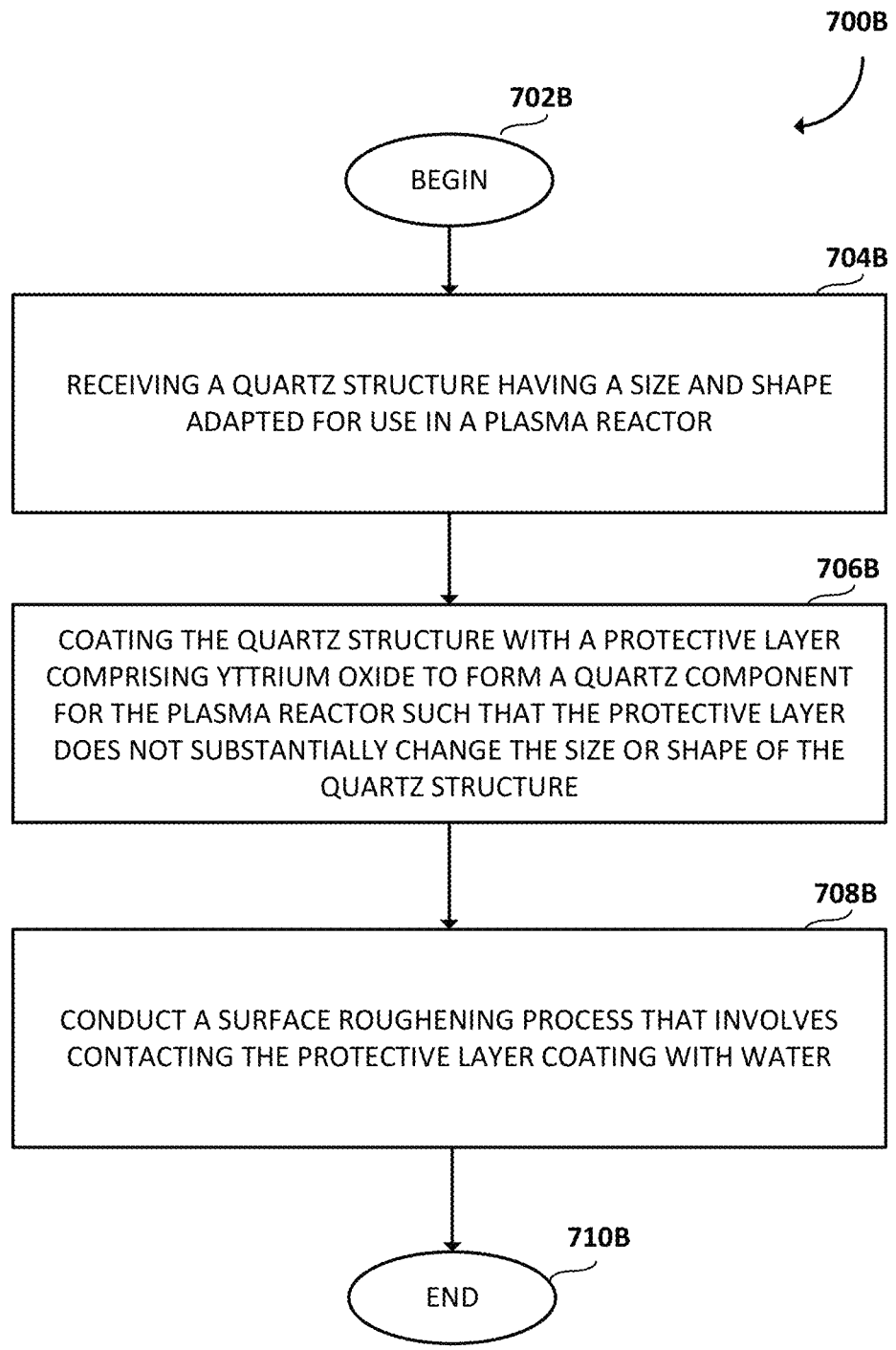
Figure 8:
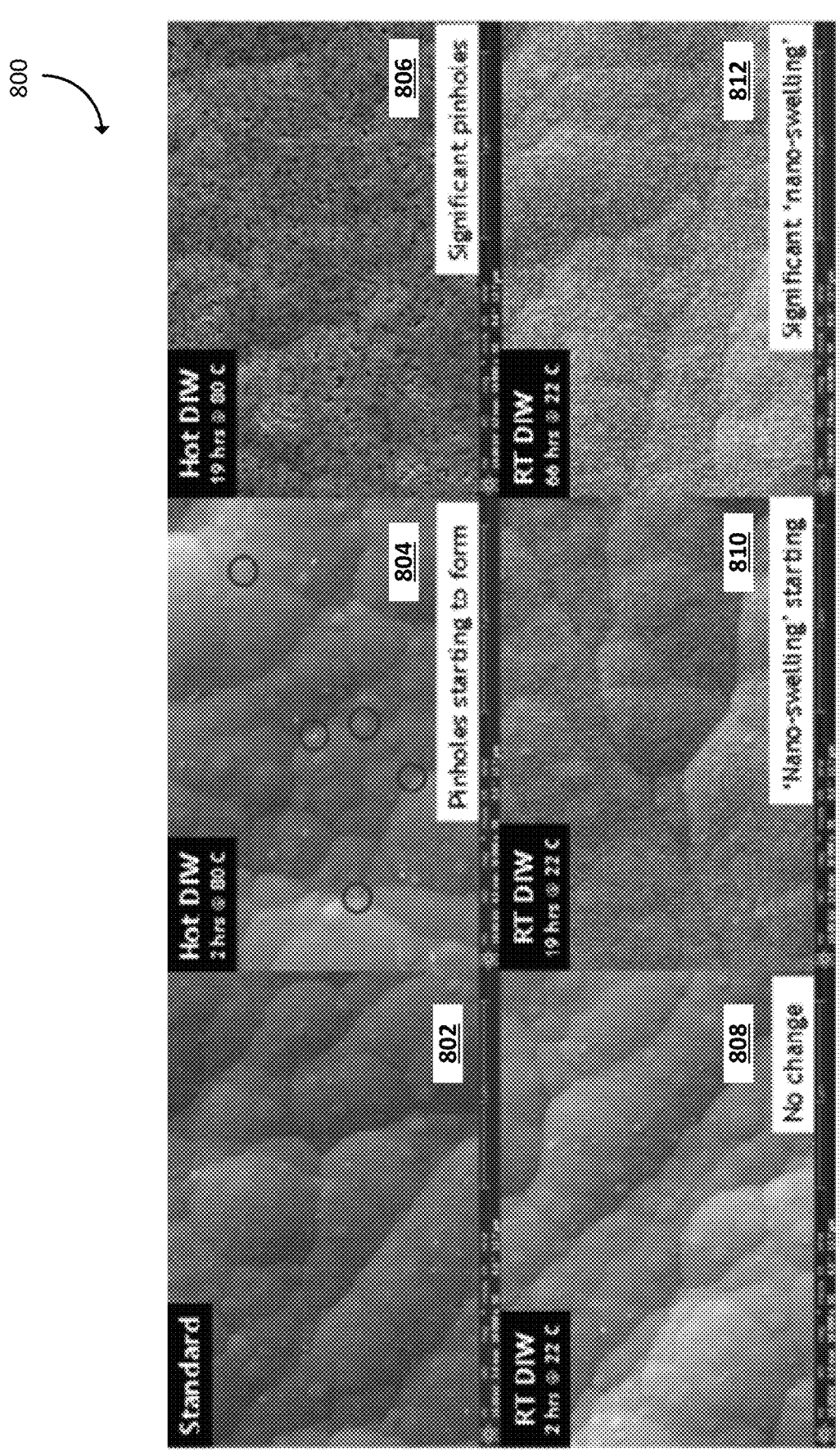
FIG. 8 presents micrographs of textured surfaces of yttrium oxide protective layers.

In certain embodiments, the surface of the protective layer formed on quartz is further textured, or roughened. Building upon the quartz component fabrication process 700A, a further fabrication process 700B is shown in FIG. 7B, and includes an additional operation, i.e., operation 708B, for conducting a surface roughening process, described further herein. The roughening process involves contacting the protective layer comprising yttrium oxide with water after completing operation 706B. As depicted, process flow 700B concludes at operation 710B. Operations 702B-706B may be implemented in a manner substantially similar to that discussed earlier for corresponding operations 702A-706A in process flow 700A and thus are not described in detail again.

As shown in process flow 700B, in some implementations, the texturing process involves soaking the coated quartz component in a texturing bath. Typically the bath has a particular composition. Examples of suitable baths include acid-containing baths and water, e.g., deionized (DI) water. The temperature and time of the soak may be selected to permit an appropriate degree or texturing. In certain embodiments, the temperature of a deionized water bath is between about 50° C. and 100° C., e.g., about 80° C. In certain embodiments, the duration of contact between a quartz component and a texturing bath is between about 4 to 19 hours.

Example benefits associated with conducting surface roughening processes of the yttrium oxide protective layer include better adhesion of reactor pre-coat and better adhesion of reaction, e.g., etch process, byproducts that might otherwise flake off prematurely. Further, the reactor pre-coat might also flake off prematurely if not well adhered.

In certain embodiments, roughness of a yttrium oxide layer formed via ALD can be tuned to $R_a$=0.03 µm to 0.3 µm by adjusting the deionized water temperature and soaking time.

CONCLUSION

In the preceding detailed description, numerous specific implementations were set forth in order to provide a thorough understanding of the disclosed implementations. However, as will be apparent to those of ordinary skill in the art, the disclosed implementations may be practiced without these specific details or by using alternate elements or processes. In other instances, well-known processes, procedures, and components have not been described in detail so as not to unnecessarily obscure aspects of the disclosed implementations. Unless otherwise specified, end points in numerical ranges include variations of about +/−5% of the recited values.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:
1. A quartz component comprising:
  a) a quartz structure having a size and shape adapted for use as a component of a plasma reactor; and
  b) a protective layer comprising yttrium oxide disposed on at least one surface of the quartz structure that, when installed, is exposed to plasma generated in the plasma reactor during operation,
  wherein the protective layer does not substantially change the size or shape of the quartz structure and the protective layer continuously and conformally coats the at least one surface of the quart structure, wherein the protective layer has a thickness of between about 10 nm and 10 μm, and wherein the thickness is an average thickness over the at least one surface of the quartz structure.

2. The quartz component of claim 1, wherein the quartz component has a size and shape to serve as a window between a plasma source located exterior to the plasma reactor and an interior region of the plasma reactor.

3. The quartz component of claim 1, wherein the quartz component is a quartz window configured to be disposed in the plasma reactor at a position permitting radio frequency or microwave power from a radio frequency or microwave source to pass through the quartz window into an interior region of the plasma reactor.

4. The quartz component of claim 3, wherein the quartz window has a thickness of between about 1 cm and 3 cm.

5. The quartz component of claim 3, wherein the quartz window is substantially flat and has a diameter or length that is between about 40 cm and 100 cm.

6. The quartz component of claim 1, wherein the quartz component is a quartz injector comprising one or more flow passages for introducing gas into an interior region of the plasma reactor and/or removing the gas from the interior region of the plasma reactor.

7. The quartz component of claim 1, wherein the quartz component is a hollow dome.

8. The quartz component of claim 1, wherein the quartz component has a surface roughness, $R_a$, of between about 0.01 μm and 2 μm, wherein the surface roughness is an average surface roughness over a surface of the quartz component.

9. The quartz component of claim 1, wherein the protective layer has, on average, a porosity of less than about 1%.

10. The quartz component of claim 1, wherein the protective layer comprises yttrium oxide crystallites having, on average, a largest cross-sectional dimension of between about 10 nm and 100 nm.

11. The quartz component of claim 1, wherein the protective layer comprises at least about 90% by mass yttrium oxide.

12. The quartz component of claim 1, wherein the protective layer comprises at least about 99% by mass yttrium oxide.

13. The quartz component of claim 1, wherein the protective layer has a thickness of between about 10 nm and 10 μm and a surface roughness $R_a$ of between about 0.03 μm and 0.3 μm, wherein the thickness is an average thickness over a surface of the quartz component.

14. A plasma reactor comprising:
a substrate support configured to hold a substrate during a plasma processing operation;
a plasma source configured to provide power to an interior region of the plasma reactor where, during operation, a plasma is formed;
a quartz component comprising:
a) a quartz structure having a size and shape adapted for use as a component of the plasma reactor; and
b) a protective layer comprising yttrium oxide disposed on at least one surface of the quartz structure that, when installed, is exposed to the plasma when formed in the plasma reactor, wherein the protective layer does not substantially change the size or shape of the quartz structure and the protective layer continuously and conformally coats the at least one surface of the quart structure, wherein the protective layer has a thickness of between about 10 nm and 10 μm, wherein the thickness is an average thickness over the at least one surface of the quartz structure; and
a controller comprising program instructions for causing the plasma source to provide radio frequency or microwave power to the interior region of the plasma reactor.

15. The plasma reactor of claim 14, wherein the quartz component in the plasma reactor is disposed at a location where, during operation, the plasma will contact or be proximate to the quartz component.

16. The plasma reactor of claim 15, wherein the plasma is a hydrogen-containing plasma.

17. The plasma reactor of claim 14, wherein the plasma reactor is an etching tool, an ashing tool, and/or a deposition tool.

18. The plasma reactor of claim 14, wherein the plasma source comprises coils.

19. The plasma reactor of claim 14, wherein the plasma source comprises a radio frequency generator.

20. The plasma reactor of claim 14, wherein the plasma source comprises a microwave generator.

21. The plasma reactor of claim 14, wherein the quartz component has a size and shape to serve as a window between the plasma source and the interior region of the plasma reactor.

22. The plasma reactor of claim 14, wherein the quartz component is a quartz window configured to be disposed in the plasma reactor at a position permitting the radio frequency or microwave power from a radio frequency or microwave source to pass through the quartz window into the interior region of the plasma reactor.

23. The plasma reactor of claim 22, wherein the quartz window has a thickness of between about 1 cm and 3 cm.

24. The plasma reactor of claim 22, wherein the quartz window is substantially flat and has a diameter or length that is between about 40 cm and 100 cm.

25. The plasma reactor of claim 14, wherein the quartz component is a quartz injector comprising one or more flow passages for introducing gas into the interior region of the plasma reactor and/or removing the gas from the interior region of the plasma reactor.

26. The plasma reactor of claim 14, wherein the quartz component is a hollow dome.

27. The plasma reactor of claim 14, wherein the quartz component has a surface roughness, $R_a$, of between about 0.01 μm and 2 μm, wherein the surface roughness is an average surface roughness over a surface of the quartz component.

28. The plasma reactor of claim 14, wherein the protective layer has, on average, a porosity of less than about 1%.

29. The plasma reactor of claim 14, wherein the protective layer comprises yttrium oxide crystallites having, on average, a largest cross-sectional dimension of between about 10 nm and 100 nm.

30. The plasma reactor of claim 14, wherein the protective layer comprises at least about 90% by mass yttrium oxide.

31. The plasma reactor of claim 14, wherein the protective layer comprises at least about 99% by mass yttrium oxide.

* * * * *